Nov. 6, 1962 D. HALTON 3,063,016

BINARY COUNTING CIRCUITS

Filed Sept. 8, 1961

2 Sheets-Sheet 1

INVENTOR:
DONALD HALTON.

BY Irwin S. Thompson
ATTY.

Nov. 6, 1962 D. HALTON 3,063,016

BINARY COUNTING CIRCUITS

Filed Sept. 8, 1961 2 Sheets-Sheet 2

INVENTOR:
DONALD HALTON.
BY Irwin S. Thompson
ATTY.

3,063,016
BINARY COUNTING CIRCUITS

Donald Halton, Liverpool, England, assignor to Automatic Telephone & Electric Company Limited, Liverpool, England, a British company Filed Sept. 8, 1961, Ser. No. 136,839
Claims priority, application Great Britain Sept. 24, 1960
1 Claim. (Cl. 328—42)

The invention relates to binary counting circuits.

The type of counter is well known in which the binary element in each stage is controlled by a gate circuit which has a number of inputs equal to the number of preceding binary stages, each input being fed from a different one of the preceding stages. This type of circuit has the great advantage of speed in operation, because the operation of any one stage is not dependent upon the accumulated time delays inherent in the binary circuits of all the preceding stages. There are, however, certain disadvantages associated with a counter circuit of this type employing more than a small number of stages. For example, the size of a gating circuit increases as the digital significance of its stage increases, and apart from the difficulty of making a satisfactory conventional diode gate with many inputs, the difficulty of mounting such gates physically is soon encountered. In addition to this, the load offered to the output circuits of the early stages in a large counter can become very great, because of the large number of gates which have to be driven, and the load supplied by each stage of the counter is, in general, different from the load supplied by each other stage.

It is the object of the invention to provide a binary counting circuit capable of operation at high-speed in which the above disadvantages are obviated.

According to the invention, in a binary counting circuit including a plurality of cascade-connected bistable elements each of which except the first element is controlled by all the preceding elements and by pulses applied substantially simultaneously to all the elements, the outputs from the set sides of an odd-numbered element and of the succeeding even-numbered element are combined in a coincidence gate circuit, the output of which is fed to coincidence gate circuits controlling the next pair of elements through a device which presents a low impedance output to said last-mentioned coincidence gate circuits.

In the counting circuit according to the invention only a small number of different loads is supplied by each of the binary circuits even in a counter with a very large number of stages, while the gate circuits each have a very small number of inputs, again even in a very large counter.

Figure 2:
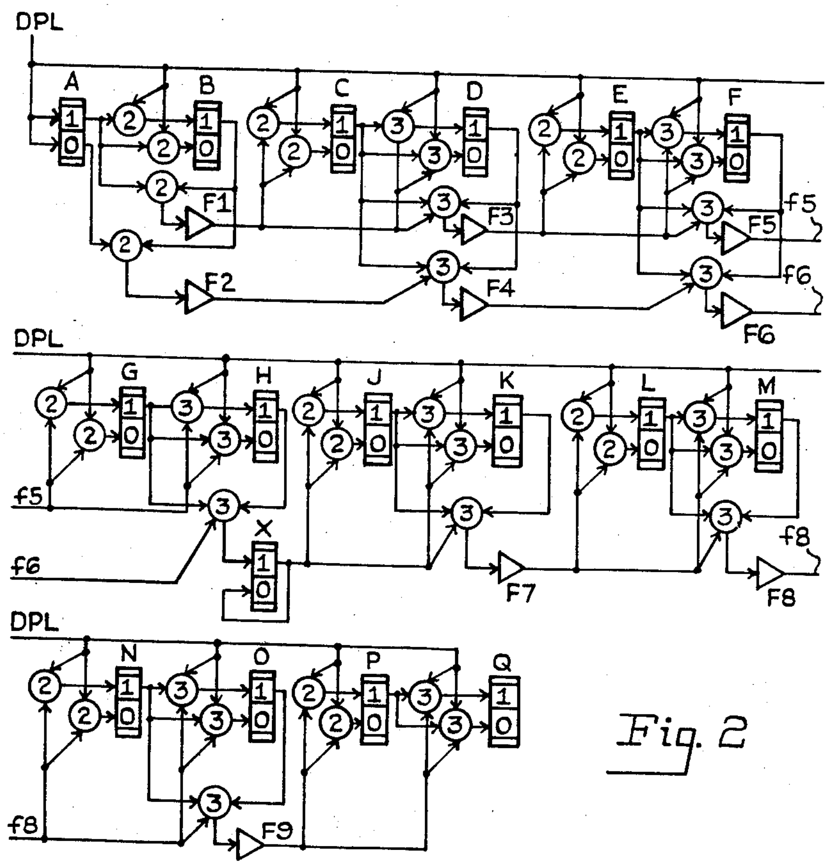
Figure 3:
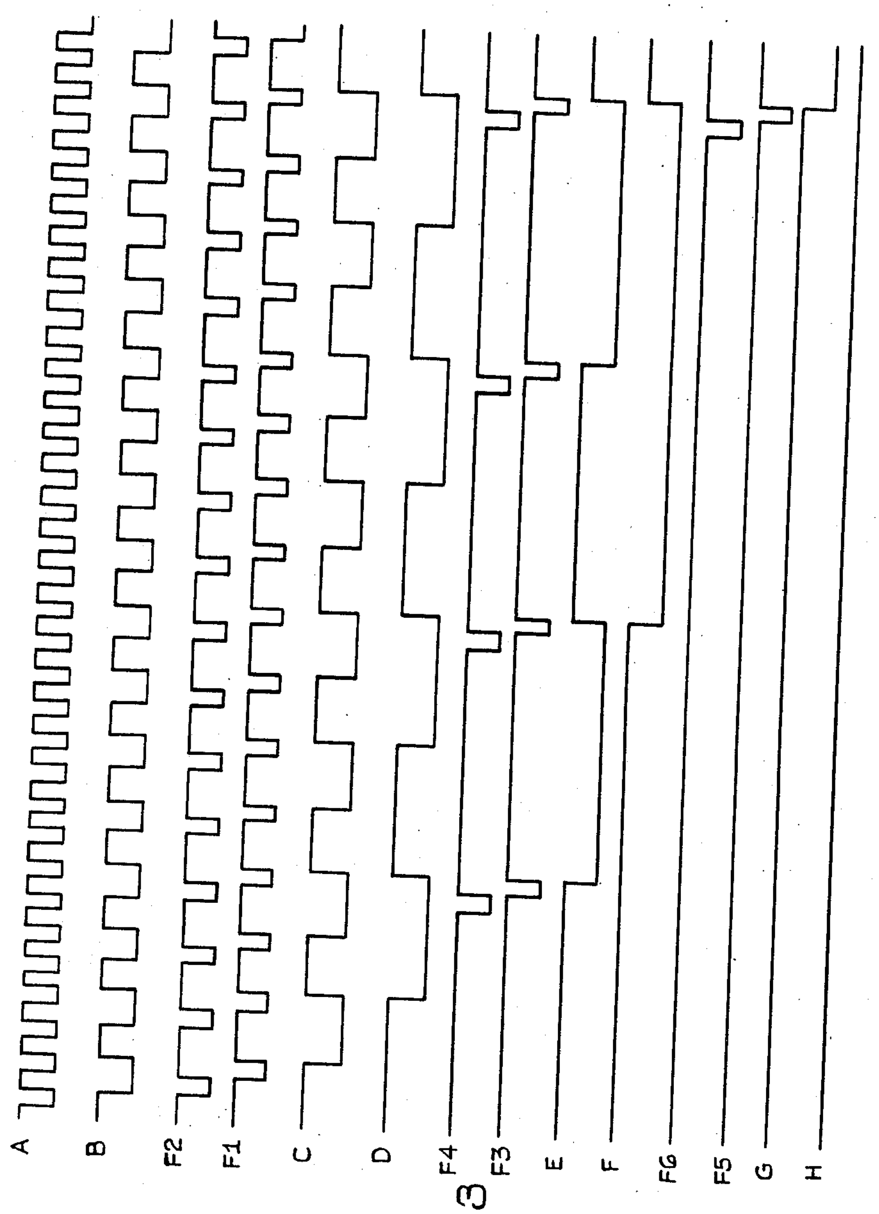

The invention will be understood from the following description of one embodiment, which shows a binary counter having 16 stages, and therefore capable of a total count of 65536. It should be read in conjunction with the accompanying drawings comprising FIGS. 1–3, of which FIG. 1 shows the circuit of a typical toggle circuit suitable for use as one stage of the counter, FIG. 2 shows the circuit of a counter according to the invention, in symbolic form, and FIG. 3 is a timing chart illustrating the operation of part of this circuit.

Figure 1:
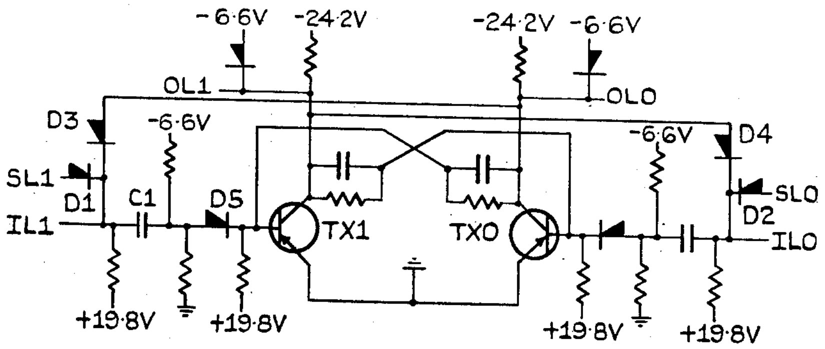

The toggle circuit shown in FIG. 1 is a conventional bistable circuit comprising two grounded emitter transistors with collectors and bases cross-coupled, the transistors being arranged to conduct alternately. In the "1" condition of the circuit, transistor TX1 is cut off, and transistor TX0 is conducting, while in the "0" condition transistor TX1 conducts and transistor TX0 is cut off. A clamping circuit is provided in the collector of each transistor, which restricts the voltage swing on the respective output leads OL1 and OL0 to limits of approximately 6 volts negative and earth potential. Thus, in the "1" condition of the circuit, the output lead of the "1" side, OL1, is at approximately 6 volts negative, and the output lead OL0 of "0" side is at approximately earth potential, while in the "0" condition of the circuit the output potentials are reversed.

The circuit is intended to be driven by output signals from coincidence gates which have the same output voltage conditions as the toggle circuit, i.e. the "signal on" condition is 6 volts negative and the "signal off" condition is earth potential. These driving signals are applied to the 1 and 0 sides of the toggle circuit at leads IL1 and IL0 respectively. The driving signals at the input of the toggle circuit are, however, subject to the control of a strobe pulse source which is connected to each side of the toggle circuit via diodes D1 and D2 at leads SL1 and SL0 respectively, and also of feedback signals which are taken from the two output leads of the toggle circuit to the opposite input leads via further diodes D3 and D4. The strobe pulses provide an accurate timing signal to enable the operation of the toggle circuit to take place at accurately defined instants, while the feedback signals fed via the diodes D3 and D4 are arranged to prevent an input signal from being effective when it is applied to the particular side of the circuit to which the latter has already been set, and also to avoid current drain on the strobe pulse source under these circumstances.

The circuit operates as follows. Assume that the circuit is in the "0" condition with transistor TX1 conducting. If an input signal is applied to lead IL1, the potential of this lead becomes 6 volts negative for the duration of the input signal. With no strobe signal present, lead SL1 is also at 6 volts negative, and so is the feedback path from the collector of transistor TX0. While these conditions exist, the capacitor C1 is enabled to charge, and its charging time is arranged to be shorter than the input signal length. The strobe pulse next received at lead SL1 is coincident with the termination of the driving pulse at lead IL1, and is a positive-going pulse, i.e. lead SL1 is momentarily changed in potential from 6 volts negative to earth potential. The strobe pulse therefore backs off diode D3, and the positive peak of the pulse differentiated by the capacitor C1 and applied to the base of transistor TX1 causes the latter to be cut off. The negative peak of the differentiated strobe pulse is blocked by diode D5, and is therefore ineffective at transistor TX1. The normal toggle action of the circuit takes place to reverse the condition of the two transistors.

If a further driving pulse is applied to lead IL1 when the toggle circuit is in the "1" condition, i.e. when transistor TX0 is conducting, there is no change in potential at lead IL1, because the latter is held at earth potential by the feedback path from the collector of transistor TX0. Diode D1 in the strobe input lead is backed off and diode D3 in series with the emitter/collector path of transistor TX0 presents a low impedance to signals of 6 volts negative applied to lead IL1. The state of charge of capacitor C1 is therefore unaffected by such a signal, and because its left-hand plate is already at earth potential, a subsequent strobe pulse is not transmitted to the base of transistor TX1. It will be appreciated that the main advantage of this arrangement resides in the fact that a strobe pulse source can be connected to a large number of toggle circuits without being overloaded, because the load presented to the pulse source at any instant will comprise only those toggle circuits which it is required to switch from one condition to the other.

The toggle circuit shown in symbolic form in the remaining drawings are all of the type shown in FIG. 1.

To simplify the drawing, however, only the inputs for the driving pulses are shown, i.e. leads IL1 and IL0 of the circuit FIG. 1, the strobe input leads, feedback leads and output leads OL1, OL0 being omitted. In the toggle circuit symbols designated A, B, C etc., the input leads to the "1" and "0" sides are shown in the conventional way marked with arrow heads and entering from the left-hand side, while the output leads extend from the right-hand side. The coincidence gates of these drawings are also shown by the conventional symbol of a circle containing a number representing the number of input signals required to open the gate. In the present circuit, only AND gates are employed. In addition to toggle circuits and gates, the only other elements used are pulse amplifier circuits, or, more accurately, impedance conversion circuits, which are of the cathode follower or emitter follower types. These are shown with the conventional amplifier symbol of a triangle with its apex indicating the direction of amplification and their function is to present a low impedance output to the subsequent gate circuits where two gate circuits would otherwise be connected directly in series with one another.

The counter operates as follows. Assume that all the toggle circuits are initially in the "0" condition. The first driving pulse appearing on lead DPL is applied to the input leads of both sides of the toggle circuit A. The pulse causes this toggle circuit to assume its "1" condition upon the occurrence of the following strobe pulse, and the next driving pulse on lead DPL causes toggle circuit A to revert to the "0" condition upon the occurrence of the next strobe pulse. This second driving pulse on lead DPL will also be applied to the two sides of toggle circuit B, since the two AND gates controlling the input to this toggle circuit will at that instant be conditioned by the output of the "set," or "1," side of toggle circuit A, and the second strobe pulse will therefore also be effective in setting toggle circuit B to its "1" condition. At the instant that toggle circuit A takes up its "0" condition and toggle circuit B takes up its "1" condition, output signals from these two toggle circuits will be applied to the follower circuit F2 through its input gate, although the output of this follower circuit is, in fact, ineffective at this stage of the count.

The next driving pulse on lead DPL again causes toggle circuit A to be set to the "1" condition on the occurrence of the ensuing strobe pulse, and this results in an output being applied from the "1" side of both toggle circuits A and B to the follower circuit F1. The output from this follower circuit is also ineffective at this stage, and in the meantime, of course, the input to the follower circuit F2 has been terminated. The fourth driving pulse on lead DPL is, however, now applied to toggle circuits A, B and C, the input gates for toggle circuit B being conditioned by the output of the "1" side of toggle circuit A, and the input gates to toggle circuit C being conditioned by the output of the follower circuit F1. This fourth driving pulse, in conjunction with the ensuing strobe pulse, causes toggle circuits A and B to be reset to their "0" conditions, while toggle circuit C is set to its "1" condition.

The fifth, sixth and seventh driving pulses are similar in effect to the first three, although toggle circuit C is in the set condition when these pulses are received. The eighth driving pulse finds toggle circuits A, B and C in the set condition, and follower circuit F1 will also be producing an output. The next strobe pulse will therefore result in the resetting of toggle circuits A, B and C, and the setting of toggle circuit D, which has all three inputs to each of its input gates energised. There is, at this stage, no input applied to either of the followers F3 or F4, the former of which requires toggle circuits A, B, C and D to be in the set condition simultaneously, and the latter of which requires toggle circuit A to be reset, and toggle circuits B, C and D to be in the set condition before it receives an input. This last-mentioned condition occurs on the occurrence of the 14th driving pulse and its following strobe pulse, and the condition for applying an input to the follower circuit F3 occurs on the next, i.e. the 15th, driving pulse.

The sequence of operations continues in a similar manner to that described, the output of each odd-numbered follower circuit F1, F3 and F5 providing a drive for the following pair of toggle circuits until the seventh and eighth toggle circuits are reached. The even-numbered follower circuits F2, F4 and F6 always come into operation one strobe pulse earlier than the corresponding follower circuits F1, F3 and F5, at the appropriate stage of the count. When toggle circuit H is first set, an input is applied to the "1" side of toggle circuit X, through a gate fed from the "1" output of toggle circuit H, the "1" output of toggle circuit G, which is on the point of being reset, and from the output of follower F6 over lead *f6*. Although toggle circuit X is thus set at the instant of setting toggle circuit H each time toggle circuit H is set, there is no danger of subsequent toggle circuits driven from the output of toggle circuit X, being operated prematurely, because the delay introduced in the toggle circuit itself prevents an output from being obtained from it until after the strobe pulse which causes it to be set has terminated. Toggle circuit X includes a feedback circuit which causes it to be reset by the strobe pulse next occurring after it has been set. The introduction of this toggle circuit thus effectively eliminates misoperation of the circuit by the build-up of time delays which might occur if more than three follower circuits were used in series.

The second half of the counter, toggle circuits J, K and so on, can employ only a single chain of follower circuits, F7, F8 and F9, corresponding to follower circuits F1, F3 and F5 in the first half of the counter, because the build-up of time delays does not become serious until more than three follower circuits are connected in series. If more than sixteen binary stages were used, however, a further toggle circuit corresponding to toggle circuit X would have to be employed at the end of each section of eight binary stages, and further follower circuits corresponding to followers F2, F4 and F6, each coming into operation one strobe pulse earlier than the follower circuits corresponding to F1, F3 and F5, would have to be provided to drive each toggle circuit such as X.

The timing of the operation of various parts of the circuit will be better appreciated from the timing chart of FIG. 3, which, although it does not include all the stages of the circuit, shows sufficient for the timing of the operation to be understood. The various lines of this figure correspond to those elements of the circuit which are similarly designated, the two levels for each line representing the set and reset condition of the toggle circuits, and the "signal on" and "signal off" conditions for the outputs of the follower circuits. In the former case, the set, or "1," condition of the toggle circuit is represented by the line being at the lower level, and the reset, or "0," condition is represented by the line at the upper level. Similarly, for the follower circuits, the line at the lower level represents the "signal on" condition and at the upper level represents the "signal off" position.

It will thus be seen that a counter circuit has been provided in which the control gates have a maximum of three inputs, and in which only a small number of gates is fed by any one toggle circuit.

I claim:

A binary counting circuit comprising a plurality of cascade-connected bi-stable elements each of which except the first element is controlled by all the preceding elements and by pulses applied substantially simultaneously to all the elements, a plurality of coincidence gate circuits, a plurality of circuit devices, the outputs from the set sides of an odd-numbered one of said elements and of the succeeding even-numbered one of said elements being combined in one of said coincidence gate circuits the output from which is fed to further coincidence gate circuits controlling the next pair of elements through one of said circuits devices which presents a low impedance output to said further coincidence gate circuits and the output from the reset side of the first element and the output from the set side of the second element and the outputs from the set sides of the subsequent pairs of elements up to and including the *n*th pair are each combined pair-by-pair in a separate coincidence gate circuit, the separate coincidence gate circuits being connected in cascade by further of said devices and an additional bi-stable element controlled by the separate coincidence gate circuit associated with the *n*th pair of elements, the output from the set side of said additional bi-stable element being applied to the next succeeding odd-numbered bi-stable element.

References Cited in the file of this patent

UNITED STATES PATENTS

| | | |
|---|---|---|
| 2,774,868 | Havens | Dec. 18, 1956 |
| 2,816,223 | Nelson | Dec. 10, 1957 |
| 2,853,238 | Johnson | Sept. 23, 1958 |
| 2,956,181 | Norman | Oct. 11, 1960 |